(12) United States Patent  
Sauer et al.

(10) Patent No.: US 8,258,497 B2  
(45) Date of Patent: Sep. 4, 2012

(54) FABRICATING ELECTRONIC-PHOTONIC DEVICES HAVING AN ACTIVE LAYER WITH SPHERICAL QUANTUM DOTS

(75) Inventors: Nick Sauer, Hamilton Square, NJ (US); Nils Weimann, Gillette, NJ (US); Liming Zhang, Marlboro, NJ (US)

(73) Assignee: Alcatel Lucent, Paris (FR)

( * ) Notice: Subject to any disclaimer, the term of this patent is extended or adjusted under 35 U.S.C. 154(b) by 137 days.

(21) Appl. No.: 12/906,809

(22) Filed: Oct. 18, 2010

(65) Prior Publication Data

US 2011/0032964 A1 Feb. 10, 2011

Related U.S. Application Data

(62) Division of application No. 12/397,739, filed on Mar. 4, 2009.

(51) Int. Cl.
*H01L 29/06* (2006.01)
*H01L 31/102* (2006.01)

(52) U.S. Cl. ............ 257/11; 257/21; 257/79; 257/189; 257/292; 257/293; 257/615; 257/E51.016; 257/E29.168; 257/E33.008; 257/E29.069; 257/E29.071; 257/9

(58) Field of Classification Search .......... 257/9, 11, 257/21, 79, 189, 292, 293, 615, E51.016, 257/E29.168, E33.008, E29.069, E29.071
See application file for complete search history.

(56) References Cited

U.S. PATENT DOCUMENTS

| 7,858,962 | B2 * | 12/2010 | Smith et al. | 257/13 |
| 2005/0227386 | A1 * | 10/2005 | Jones et al. | 438/22 |
| 2006/0220000 | A1 * | 10/2006 | Bennett et al. | 257/14 |
| 2010/0226400 | A1 | 9/2010 | Sauer et al. | |

OTHER PUBLICATIONS

Anantathanasarn, S., et al.; Stacking and polarization control of wavelength-tunable (1.55 um region) InAs/InGaAsP/InP(100) quantum dots; Applied Physics Letters 88, (2006); pp. 063105-1 thru 063105-3.

Kawaguchi, Kenichi, et al.; "Fabrication of InAs quantum dots on InP(100) by metalorganic vapor-phase epitaxy for 1.55 um optical device applications"; Applied Physics Letters, vol. 85, No. 19, Nov. 8, 2004; pp. 4331-4333.

Lelarge, Francois, et al.; "Recent Advances on InAs/InP Quantum Dash Based Semiconductor Lasers and Optical Amplifiers Operating at 1.55 um"; IEEE Journal of Selected Topics in Quantum Electronics, vol. 13, No. 1; Jan./Feb. 2007, pp. 111-124.

Marchand, H., et al.; "Metalorganic vapor phase epitaxy of coherent self-assembled InAs nanometer-sized islands in InP(001)"; Appl. Phys. Letter. 71 (4), Jul. 28, 1997; pp. 527-529.

Franke, D., et al; "Improved Emission Wavelength Reproducibility of InP-Based All Movpe Grown 1.55 um Quantum Dot Lasers"; IEEE 2007 International Conference on Indium Phosphide and Related Materials Conference Proceedings, 195h IPRM May 14-18, 2007 Matsue, Japan; pp. 559-562.

\* cited by examiner

*Primary Examiner* — Michelle Mandala
(74) *Attorney, Agent, or Firm* — Hitt Gaines, PC

(57) ABSTRACT

A method for manufacturing an electronic-photonic device. Epitaxially depositing an n-doped III-V composite semiconductor alloy buffer layer on a crystalline surface of a substrate at a first temperature. Forming an active layer on the n-doped III-V epitaxial composite semiconductor alloy buffer layer at a second temperature, the active layer including a plurality of spheroid-shaped quantum dots. Depositing a p-doped III-V composite semiconductor alloy capping layer on the active layer at a third temperature. The second temperature is less than the first temperature and the third temperature. The active layer has a photoluminescence intensity emission peak in the telecommunication C-band.

20 Claims, 10 Drawing Sheets

FABRICATING ELECTRONIC-PHOTONIC DEVICES HAVING AN ACTIVE LAYER WITH SPHERICAL QUANTUM DOTS

CROSS-REFERENCE TO RELATED APPLICATIONS

This Application is a Divisional of U.S. application Ser. No. 12/397,739 filed on Mar. 4, 2009, to Nick Sauer et al, entitled "FABRICATING ELECTRONIC-PHOTONIC DEVICES HAVING AN ACTIVE LAYER WITH SPHERICAL QUANTUM DOTS," currently allowed; commonly assigned with the present invention and incorporated herein by reference.

TECHNICAL FIELD

This application is directed, in general, to electronic-photonic devices and, more specifically, to a method of fabricating electronic-photonic devices.

BACKGROUND

There is great interest in using semiconductor quantum nanostructures to make electronic-photonic devices such as lasers and optical amplifiers. So far, the majority of the work done has been concentrated on GaAs-based quantum nanostructures with photoluminescence emission wavelengths shorter than 1.3 microns. The ability to fabricate such devices operating in the optical communications C-band is of importance for optical telecommunication applications.

SUMMARY

One aspect of the disclosure provides a method for manufacturing an electronic-photonic device. Device fabrication includes epitaxially depositing an n-doped III-V composite semiconductor alloy buffer layer on a crystalline surface of a substrate at a first temperature. Device fabrication also includes forming an active layer on the n-doped III-V epitaxial composite semiconductor alloy buffer layer at a second temperature. The active layer includes a plurality of spheroid-shaped quantum dots. Device fabrication further includes depositing a p-doped III-V composite semiconductor alloy capping layer on the active layer at a third temperature. The second temperature is less than the first temperature and the third temperature. The active layer has a photoluminescence intensity emission peak in the telecommunication C-band.

Another aspect of the disclosure provides electronic-photonic device that comprises an active layer strip. The active layer strip is located on a n-doped III-V epitaxial composite semiconductor alloy buffer layer. The active layer strip includes plurality of spheroid-shaped quantum dots. Each of the spheroid-shaped quantum dots includes a multilayered concentric stack. The multilayered concentric stack includes a first inner III-V composite semiconductor alloy high-band-gap lay. The multilayered concentric stack also includes a III-V composite semiconductor alloy well layer on the first inner III-V composite semiconductor alloy high-band-gap layer. The multilayered concentric stack also includes a second outer III-V composite semiconductor alloy high-band-gap layer on the III-V composite semiconductor alloy well layer. Again, the active layer has a photoluminescence intensity emission peak in the telecommunication C-band.

BRIEF DESCRIPTION OF THE DRAWINGS

The various embodiments can be understood from the following detailed description, when read with the accompanying figures. Various features may not be drawn to scale and may be arbitrarily increased or reduced in size for clarity of discussion. Reference is now made to the following descriptions taken in conjunction with the accompanying drawings, in which.

DETAILED DESCRIPTION

Various embodiments provide methods for fabricating electronic-photonic devices whose active layers have a photoluminescence emission intensity peak in the optical telecommunications C-band, e.g., at wavelengths centered at or near 1.55 microns. The manufacture such devices was achieved by carefully controlling the growth conditions of spheroid-shaped quantum dot nanostructures in the active layer of the device. The method of fabrication can be used in the manufacture of an telecommunication apparatuses, in which the device is configured as a laser, an optical amplifier, a high speed wavelength converter or to manufacture other types of electronic-photonic devices.

For the purposes of the present disclosure, the term III-V refers to composite semiconductor alloy materials that have one or more types of atoms that are group III elements (e.g., B, Al, Ga, In, Tl) and one or more types of atoms that are group V elements (e.g., N, P, As, Sb, Bi).

For the purposes of the present disclosure, the term spheroid-shaped quantum dot refers to a nanostructure composed of III-V semiconductor alloys that have a substantially spherical shape or hemi-spherical shapes. For instance, a quantum dot having a major axis diameter to minor axis diameter that differs by about 20 percent or less is an example of a spheroid-shaped quantum dot.

A number of example embodiments are presented below in the context of fabricating electronic-photonic devices that comprise the InAs alloy-containing quantum dots formed on InP-containing substrates and layers via epitaxial techniques such as metal-organic vapor-phase epitaxy (MOVPE). One skilled in the art would appreciate how the methods disclosed herein could be modified to fabricate electronic-photonic devices having quantum dots and substrates composed of other combinations of III-V semiconductors.

The term MOVPE as used herein refers to a chemical vapor deposition process for epitaxially growing crystalline layers of atoms e.g., of III-V semiconductors, via chemical reactions occurring at a growth surface. The reaction occurs between organic compounds or metallo-organic compounds that contain the desired atoms of the crystal of interest, and is followed by pyrolysis at an elevated temperature to form the epitaxial crystalline layer. MOVPE is in contrast to molecular beam epitaxy (MBE) where crystals are grown by the physical deposition of atoms. Certain MOVPE processes can aid the formation of spherically-shaped quantum dots with a photoluminescence emission intensity peak centered in desirable optical communication bands, e.g., the C-band. Based upon the teachings herein, one skilled in the art would appreciate that the specific temperatures, pressures, reactant compositions, reactant delivery rates, and other parameters for MOVPE, can depend on the specific type of reactor being used, and understand how to adjust these parameters accordingly.

Figure 1:
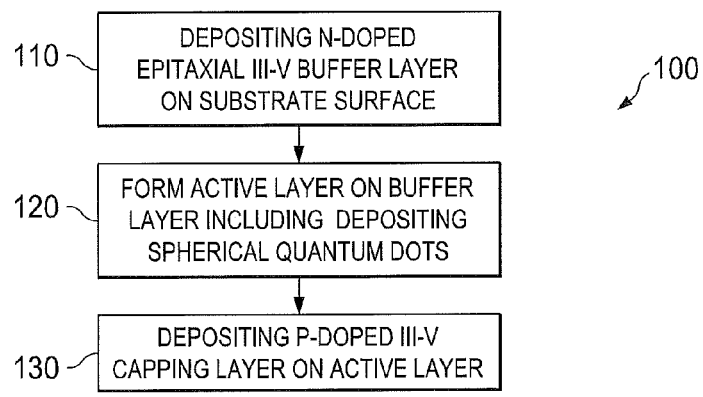
FIG. 1 presents a flow diagram of an example method of fabricating an electronic-photonic device in accordance with the disclosure.

One aspect of the disclosure is a method for manufacturing an electronic-photonic device. FIG. 1 presents a flow diagram of an example method 100 of fabricating an electronic-photonic device in accordance with the disclosure.

Fabricating the electronic-photonic device, includes a step 110 of epitaxially depositing an n-doped III-V composite semiconductor alloy buffer layer (hereinafter referred to as an n-doped III-V buffer layer) on a crystalline substrate surface at a first temperature. Fabricating the device further includes a step 120 of forming an active layer on the epitaxial n-doped III-V buffer layer formed in step 110. The active layer includes a plurality of spherically-shaped quantum dots formed at a second temperature. The fabrication of the device also includes a step 130 of depositing a p-doped III-V composite semiconductor alloy capping layer (hereinafter referred to a p-doped III-V capping layer) on the active layer at a third temperature. The second temperature used in step 120 is less than the first temperature and the third temperature used in steps 110 and 130, respectively.

In some preferred embodiments, depositing the n-doped III-V buffer layer, forming the active layer, and depositing the p-doped III-V capping layer, all include separate MOVPE depositing processes. In some preferred embodiments, the MOVPE processes taught herein may be conducive to forming an active layers having spherically-shaped quantum dots. In some cases such active layers may have a photoluminescence emission intensity in a target C-band communication wavelength (e.g., a photoluminescence intensity peak centered at 1.55 microns±0.02 microns centered at 1.55±0.02 microns).

In some embodiments, the second temperature in step 120 is less than about 500° C. and the first and third temperatures in steps 110 and 130, respectively, are both about 600° C. or greater. Temperatures of about 600° C. or higher are conducive to the deposition of the epitaxial III-V buffer layer (step 110) and III-V capping layer (step 130) that both comprise InP alloy. In some preferred embodiments, the second temperature in step 120 is in the range of about 460° C. to 470° C. For example, when the active layer formed in step 120 comprises InAs alloy, the second temperature of about 460° C. to 470° C. may help reduce the extent of As—P exchange between an active layer comprising InAs alloy and the III-V buffer layer comprising InP alloy, or, between subsequently deposited active layers and III-V capping layers. Thus, in some preferred embodiments, the active layer is substantially free of P (e.g., less than about 1 atom percent P). Reducing the extent of As—P exchange is believed to facilitate the formation of spherically-shaped quantum dots. For instance, in some cases, when the second temperature is 500° C. or greater, there is a tendency to form non-spheroidal quantum dashes that may not emit photoluminescence in the C-band telecommunication range. It is believed that excessive As—P exchange between InAs and InP layers promotes the formation of quantum dashes. Quantum dash structures, however, tend to have a photoluminescence emission intensity peak wavelength that is higher than the target C-band communication wavelength, and hence may not be as useful for telecommunication applications using the C-band.

On the other-hand, in some cases, the use of a second temperature of less than 460° C. in step 120 makes it more difficult, or sometimes impossible, to grow quantum dots. The inability to grow quantum dots at such low temperatures is believed to be related to the incomplete decomposition of reactants used as part of the MOVPE deposition process of step 120.

In some embodiments, the second temperature in step 120 of less than about 500° C., and more preferably about 460° C. to 470° C., promotes the formation of a narrow distribution of smaller diameter spheriod-shaped quantum dots. Hence there can be a high density of spheriod-shaped quantum dots in the active layer. In comparison, the use a higher temperatures in the step 120 can result in a broad distribution of higher diameter spheriod-shaped quantum dots.

For example, in some embodiments, performing step 120 at a second temperature of about 460 to 470° C. results in the formation of spheriod-shaped quantum dots (e.g., InAs-alloy containing dots) with a density of at least about $5 \times 10^{10}$ dots/$cm^2$. The formation of such a high density of quantum dots beneficially increases the intensity of the photoluminescence that can be emitted per unit areas of active layer.

For example, in some embodiments, performing step 120 at a second temperature of about 460° C. to 470° C. results in the formation of spheriod-shaped quantum dots (e.g., InAs alloy-containing dots) having an average diameter of about 30 nanometers±10 percent. Such smaller diameter dots can advantageously emit photoluminescence at the target C-band telecommunication range. Such a narrow size distribution of diameters beneficially promotes photoluminescence emissions to within a narrow wavelength range. For example, for some such embodiments, the photoluminescence emission spectrum has a full width at half maximum equal to about 210 nanometers or less. Preferably the spheriod-shaped quantum dots have an average ratio of a major axis diameter to a minor axis diameter in a range of about 1:1 to 1:1.1. The absence of substantial ellipticity in the shape of the dots is believed to help avoid unwanted polarization dependence in the photoluminescence emission from the active layer.

It is desirable for the wavelength of peak photoluminescence from the active layer to not be altered by exposure to the third temperature (step 130), or, by subsequent exposure to similar elevated temperatures used as part of additional steps in the fabrication of the device. One or more of the process parameters used to form the active layer may contribute to the constancy of the photoluminescence wavelength. The process parameters may include, but are not limited to, the compositions and thicknesses of the layers that comprise the active layer, or, the dimensions and narrow diameter distribution of the quantum dots of the active layer.

FIGS. 2-10 present cross-sectional views at selected stages in the manufacture of an example electronic-photonic device 200 using the methods described in the context of FIG. 1.

Figure 2:
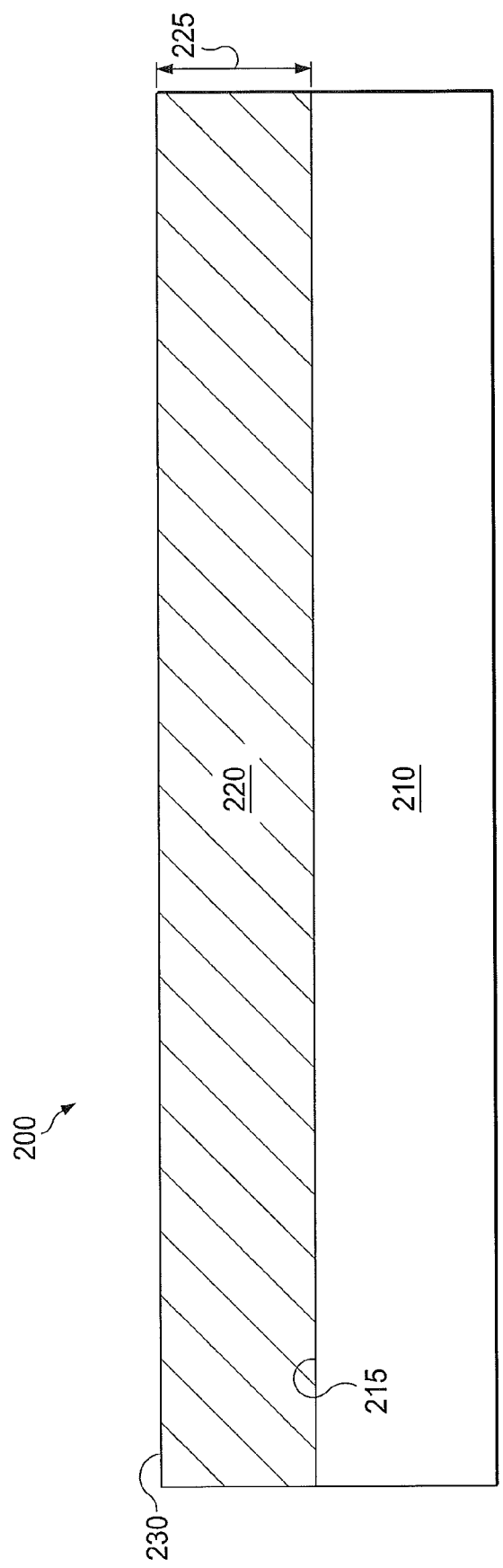

FIG. 2 shows the example electronic-photonic device 200, here configured as a buried hetro-structure laser, after providing a crystalline substrate 210. In some embodiments, the crystalline substrate 210 is or includes a III-V crystalline substrate such as an InP alloy substrate. In some preferred embodiments, the III-V crystalline substrate 210 has a surface 215 with a (100) plane (Miller index symmetry designation). One advantage of providing (100) plane is that the plane provides two cleaving surfaces that are perpendicular to the (100) plane. Having cleaving surfaces, in turn, facilitates the manufacture of the electronic-photonic device 200.

FIG. 2 also shows the device 200 after MOVPE deposition of an n-doped epitaxial III-V buffer layer 220 on the substrate surface 215 at the first temperature, in accordance with step 110 (FIG. 1). In some embodiments, the n-doped epitaxial III-V buffer layer 220 is composed of Si-doped InP alloy having a thickness 225 of about 500 nanometers. In some preferred embodiments, the ratio In:P equals about 1:1, and Si is present at a dopant-level concentrations (e.g., a concentration of about 1.0E18 atoms/cc). For example, MOVPE deposition of the n-doped epitaxial buffer layer can include introducing appropriate amounts of III-V precursor materials, such as trimethyl-indium (TMI), phosphine ($PH_3$) and a silicon-containing source gas, into a MOVPE reactor. In some preferred embodiments the silicon-containing source gas is disilane ($Si_2H_6$) although other gases well-known to those skilled in the art could be used, if desired. Although other n-type dopants could be used, in some cases Si is preferred because Si has a lower diffusivity compared to some other n-type dopants. Hence, it is easier to control the distribution of Si in the n-doped epitaxial buffer layer as compared to those other n-type dopants.

The buffer layer 220 provides an intermediate low defect-density or substantially defect-reduced crystal surface 215 for subsequent deposition of the active layer. For instance, in some embodiments the buffer layer 220 has less crystal defects than the substrate 210, and therefore provides a better quality crystal structure upon which to subsequently form the active layer on. When the substrate 210 has a surface 215 with a (100) crystallographic plane then the MOVPE deposited buffer layer 220 will also have a surface 230 (100) crystallographic plane. The presence of a substantially defect-free or low-defect density portion of the III-V buffer layer 220 may improve the confinement of emitted light to the active layer.

Figure 3A:
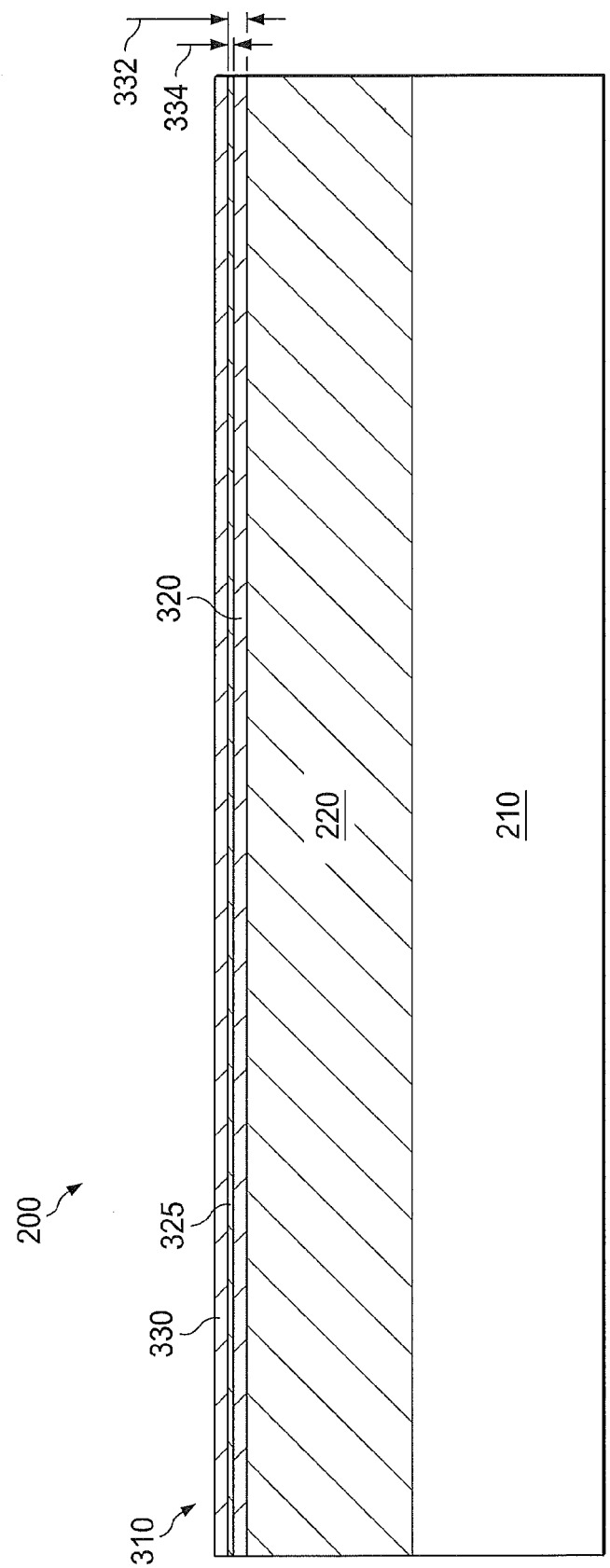
Figure 3B:
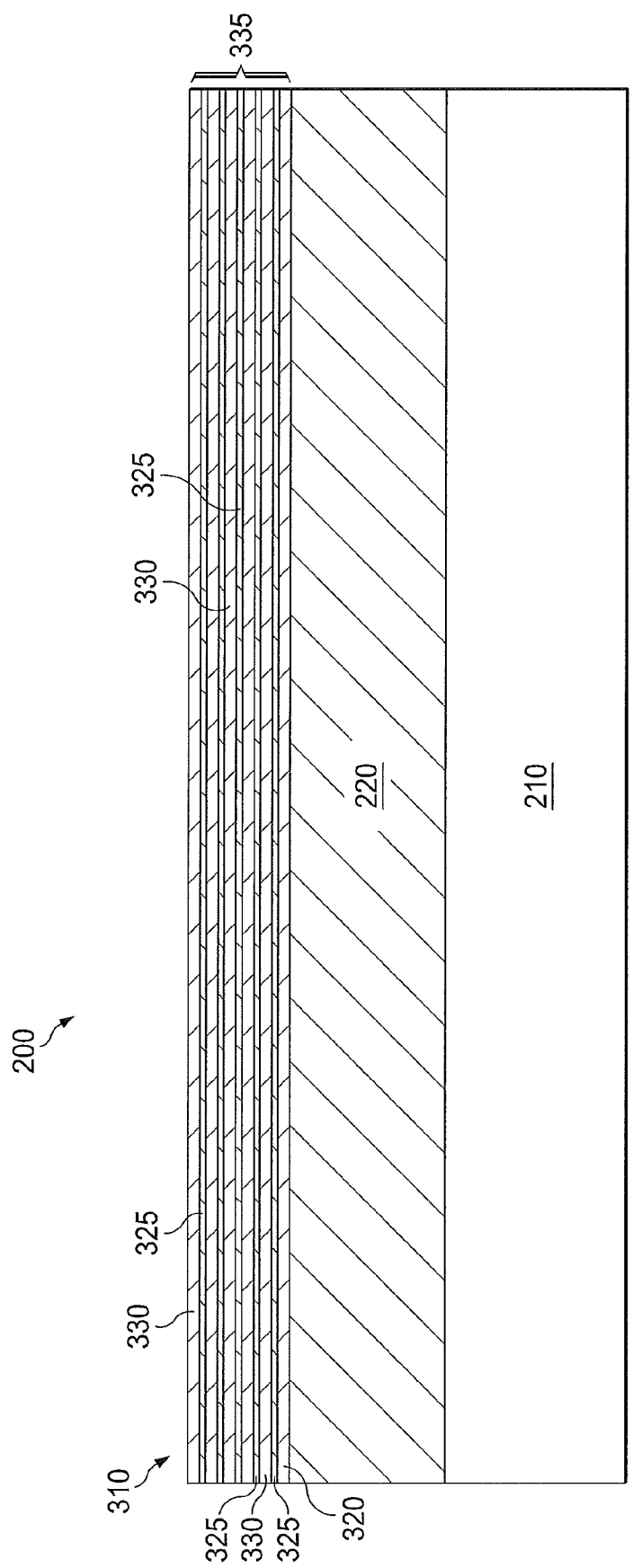
Figure 3C:
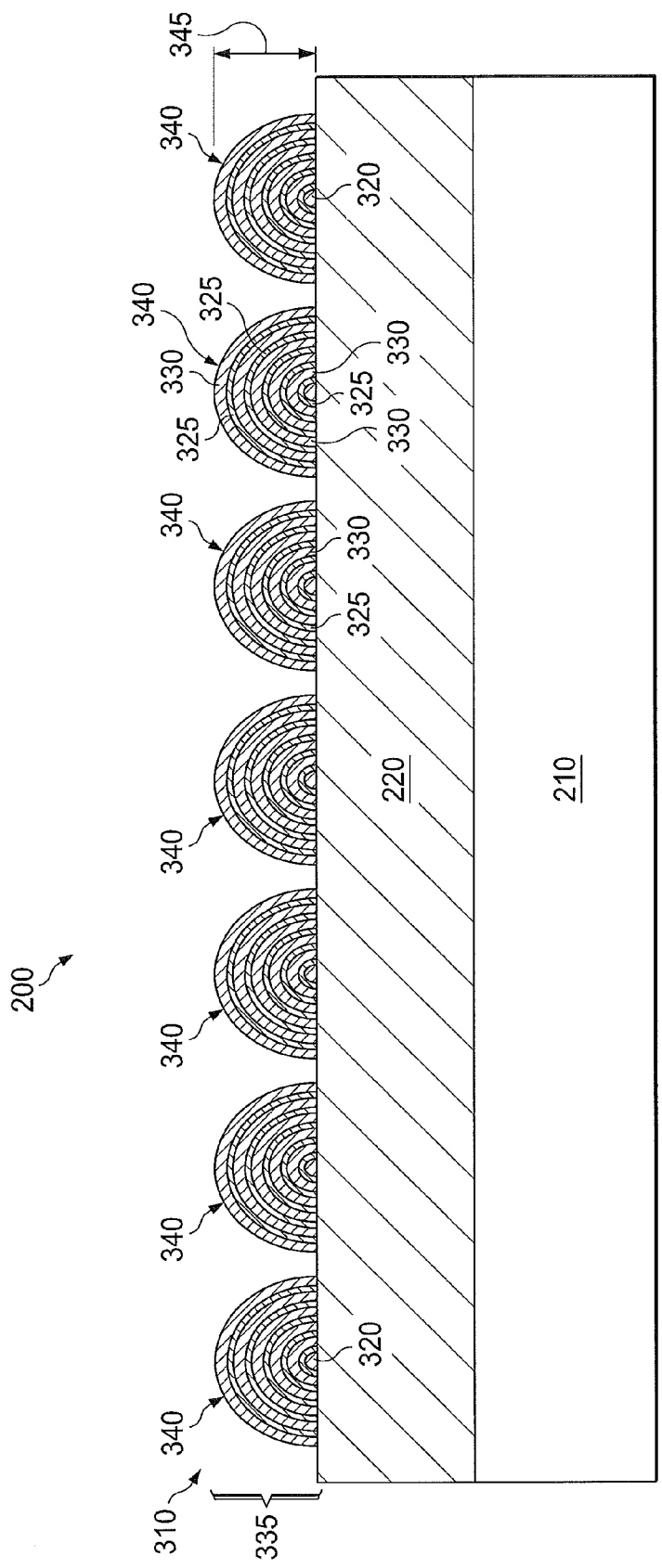

FIGS. 3A-3C show the device 200 at different stages of forming an active layer 310 on the epitaxial III-V buffer layer 220 in accordance with step 120 (FIG. 1). In some embodiments, a deposition process at the second temperature in step 120 includes a plurality of consecutive depositions of first III-V composite semiconductor alloy high-band-gap layers (herein after referred to as a III-V high-band-gap layers) and III-V composite semiconductor alloy well layer (herein after referred to as a III-V well layers). The III-V high-band-gap layers are defined as having energy band gaps (e.g., energy separating conduction and valence bands) of at least about 1 eV. The III-V well layers (e.g., quantum wells) are defined as having energy band gaps of less than about 1 eV (e.g., a low-band-gap layer).

For instance, FIG. 3A shows the device 200 after consecutively MOVPE depositing of a first III-V high-band-gap layer 320 on the buffer layer 220, MOVPE depositing of a III-V well layer 325 on the first III-V high-band-gap layer 320 and then a MOVPE depositing of a second III-V high-band-gap layer 330 on the III-V well layer 325.

In some preferred embodiments, to facilitate light confinement, the first and second III-V high-band-gap layers 320, 330 (e.g., InGaAsP alloy layers) have individual thicknesses 332 in a range of about 25 to 35 nanometers, and more preferably about 30 nanometers. In some embodiments, the III-V well layer (e.g., an InAs alloy layer) has a thickness 334 in a range of about 1 to 2 monolayers (e.g., about 0.2 to 0.4 nm) of the alloy, and more preferably, about 1 monolayer (e.g., about 0.2 nm) of the alloy. Such small thicknesses 334 of the well layer 325 may be conducive to the active layer 310 being able to emit light at the target C-band wavelength, even after being exposed to elevated temperatures in subsequent processing steps (e.g., the third temperature in step 130).

To improve light confinement in the active layer 310 it is sometimes preferable to form a plurality of well layers each being separated by III-V high-band-gap layers, to thereby form multi-layered quantum dots. For example, FIG. 3B shows the device 200, after consecutively repeating the MOVPE deposition of III-V well layers 325 and III-V high-band-gap layers 320, 330 (steps 110, 120 and 130) to form quantum dots comprising a five-fold multi-layered stack 335 (FIG. 3C). In this example, the stack 335 has five well layers 325 that are separated from each other by III-V high-band-gap layers 330.

Due to strain encountered during quantum dot formation, the maximum number of III-V alloy layers 320, 325, 330 in the stack 335 maybe limited. In some preferred embodiments, the multilayered stack 335 includes four to six separated well layers 325 of InAs alloy. In some embodiments, forming a multilayered stack 335 with more than five separated well layers 325 can result in the formation of quantum dot structures that are fragile and prone to breaking during subsequent processing steps. In other embodiments, such as where strain control mechanisms can be applied, the stack 335 may comprise more than five separated well layers 325.

FIG. 3C shows the active layer 310 after the self-assembly of quantum dots 340 from the MOVPE deposited layers 320, 325, 330 (FIG. 3A or 3B). One skilled in the art would understand that depending on the MOVPE reactor used, at a certain time, thickness and temperature in the MOVPE process, the MOVPE deposited layers 320, 325, 330 spontaneously self-assemble to form quantum dots 340 as part of the MOVPE deposition process. Each quantum dot 340 comprises a multilayered concentric stack 335 of the consecutively deposited layers 320, 325, 330. In some embodiments, each of the quantum dots 340 have a height 345 that is preferably equal to about 5.6 nanometers or less. Taller quantum dots are more prone to breaking during subsequent fabrication steps.

Figure 4:
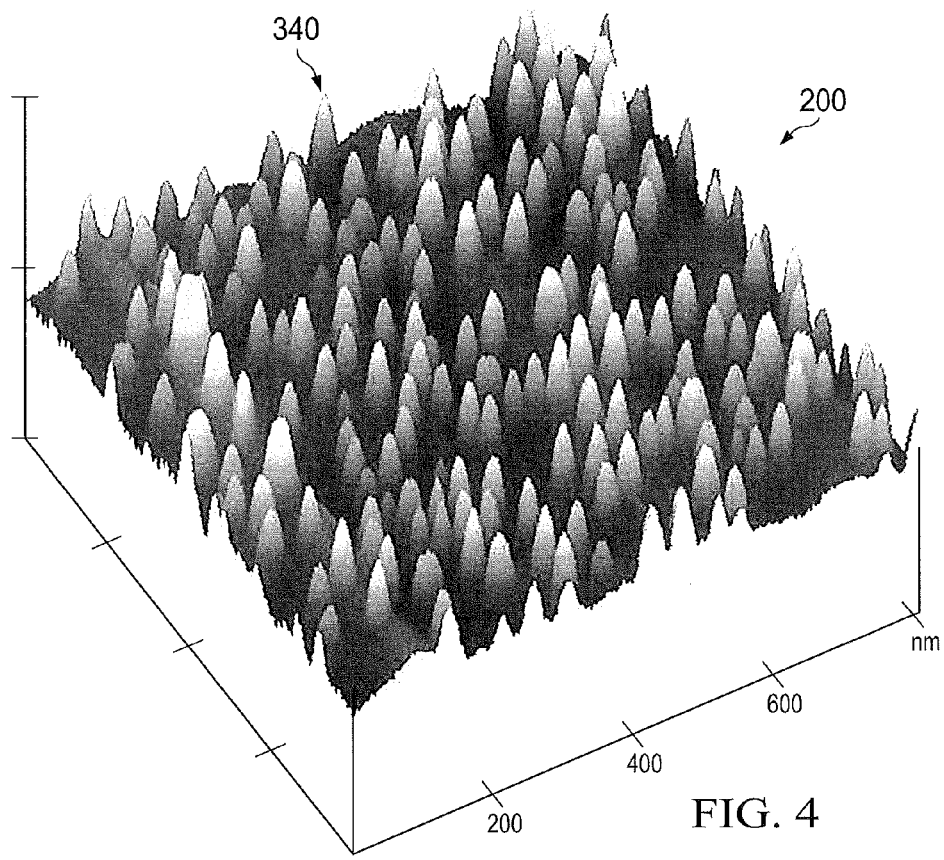
FIGS. 2-9 present cross-sectional and perspective views at selected stages in the manufacture of an electronic-photonic device such as presented in FIG. 1, and, shows embodiments of an example electronic-photonic device of the disclosure.

In some embodiments, the III-V high-band-gap layers 320, 330 are composed of an InGaAsP alloy and the well layers 325 (or layer) are composed of an InAs alloy. FIG. 4 shows an atomic force image of an example embodiment of quantum dots 340 formed by deposition of InGaAsP buffer layers and InAs well layers by a MOVPE processes.

In some cases, MOVPE deposition of each of the III-V high-band-gap layers 320, 330 (FIG. 3A-3C) can include introducing TMI, trimethyl-gallium (TMGa), arsine ($AsH_3$) and phosphine ($PH_3$) source gases into the MOVPE reactor. It is believed that including high-band-gap layers 320, 330 composed of InGaAsP alloy with a ratio of group-V atoms:group-III atoms of 19:1 to 21:1 helps to control the size of the quantum dots 340. In some preferred embodiments, the group-V:group-III ratio in the high-band-gap layers 320, 330 equals about 20:1. In some cases, when the group-V:group-III ratio is greater than 21:1, the quantum dots 340 are too large, resulting in an emission wavelength that is centered outside of the target C-band wavelength (e.g., 1.55±0.2 microns). In some cases, when the group-V:group-III ratio is less than 19:1, however, then the quantum dots 340 do not form.

In some embodiments, the well layer 325 (or layers) is composed of an InAs alloy with a In:As ratio of about 1:1. In some cases, for example, MOVPE deposition of each III-V well layer 325 includes introducing TMI and arsine ($AsH_3$) source gases into the MOVPE reactor. To help form uniform thicknesses 334 of each layer 325 (e.g., an average thickness 334 of 1 monolayer ±0.1 monolayer) the flow of source gases into the reactor are adjusted to provide a deposition rate of about 0.33 monolayers per minute. In some cases, carrier gases, such as hydrogen ($H_2$) gas, can be included in the gas flow to facilitate adjusting the deposition rate to the desired value.

Figure 5:
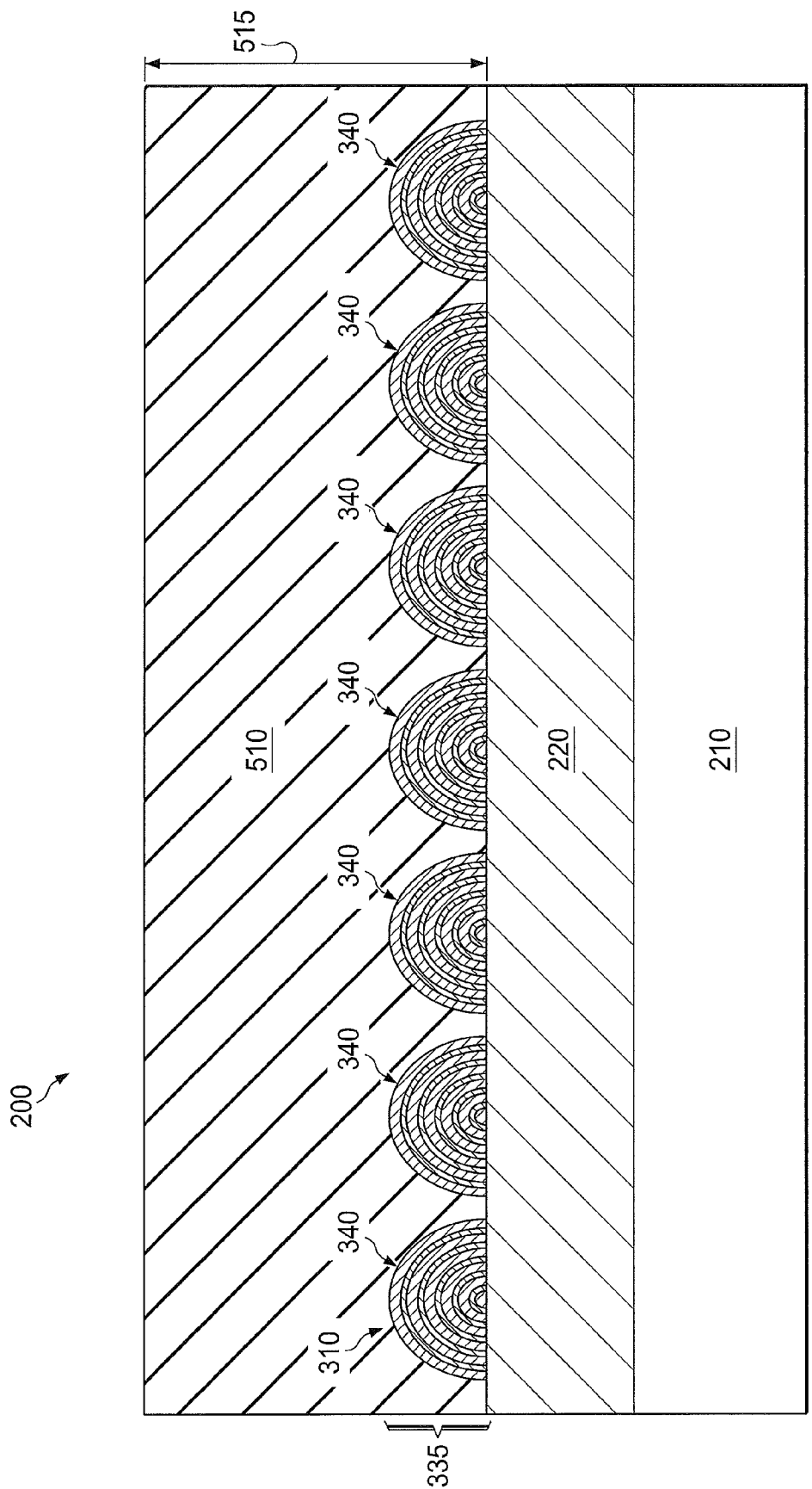

FIG. 5 shows the device 200 of FIG. 3C after MOVPE deposition of a p-doped III-V capping layer 510 on the active layer 310 at a third temperature in accordance with step 130 (FIG. 1). For example, in some embodiments forming the capping layer 510 of Zn-doped InP alloy includes introducing TMI, $PH_3$ and a zinc-containing source gas, such as diethylzinc ($(C_2H_5)_2Zn$) into the MOVPE reactor. In some preferred embodiments, light confinement in the active layer 310 is enhanced when the ratio In:P equals about 1:1, and Zn is present at dopant-level concentrations (e.g., a concentration of about 5.0E18 atoms/cc). In some cases, the thickness 515 of the capping layer 510 can equal about 500 nanometers. Although other types of p-type dopants can be used, in some cases a Zn dopant is preferred because Zn has a lower diffusivity than other p-type dopants.

Figure 6:
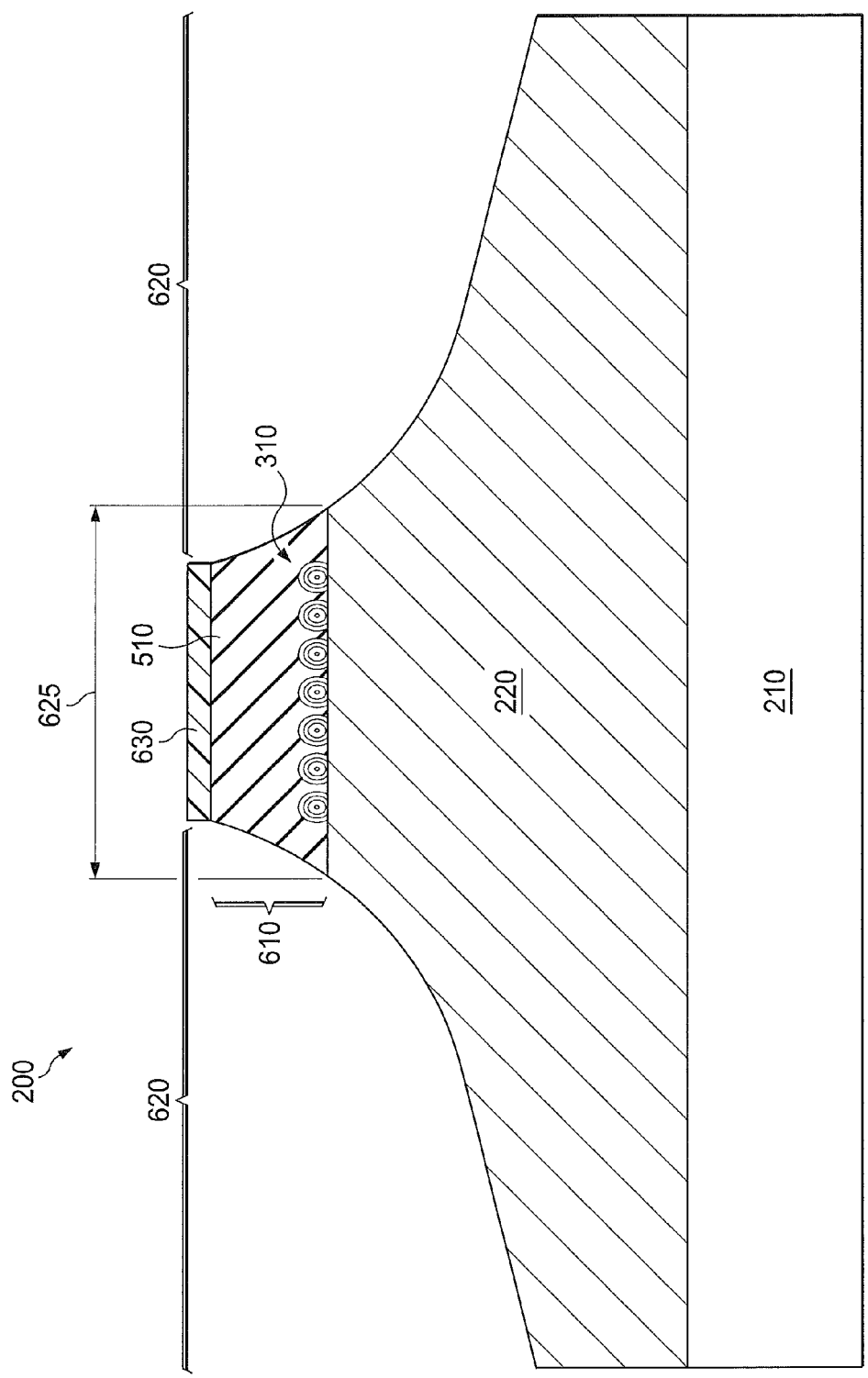

The cross-sectional view in FIG. 6 and subsequent figures are shown at lower magnification than in FIGS. 2-5 so that additional features of the device 200 can be depicted. FIG. 6 shows the device 200 after forming an active strip layer 610. Forming the active strip layer 610 including removing portions of the active layer 310 and capping layer 510 (FIG. 5) to form openings 620 adjacent to the active strip 610. In some embodiments, the active strip layer 610 has an average width 625 of about 2.5 microns and length of about 2 mm (not show, because the length dimension is in and out of the plane of the cross-sectional view shown in the figure).

In some embodiments, forming the active strip layer 610 can include conventional processes to form a hard mask layer 630 on the p-doped capping layer 510, and photo-lithographically defining the target locations of the openings 620. In some cases, the hard mask 630 is composed of glass (e.g., silica) deposited by chemical vapor deposition or other conventional processes. The hard mask 630 advantageously protects the active strip layer 610 and cap layer 510 from alteration by the etch process used to form the openings 620 (e.g., reactive ion etching, plasma etching, wet etching or other conventional techniques). For example, when the active strip layer 610 comprises InGaAsP alloy and InAs alloy layers and the cap layer 510 comprises Zn-doped InP alloy, a wet etching process can include a wet etchant of HBr:HCl:H2O2: C2H4O2 with volume ratios of about 1:5:60:180.

Figure 7:
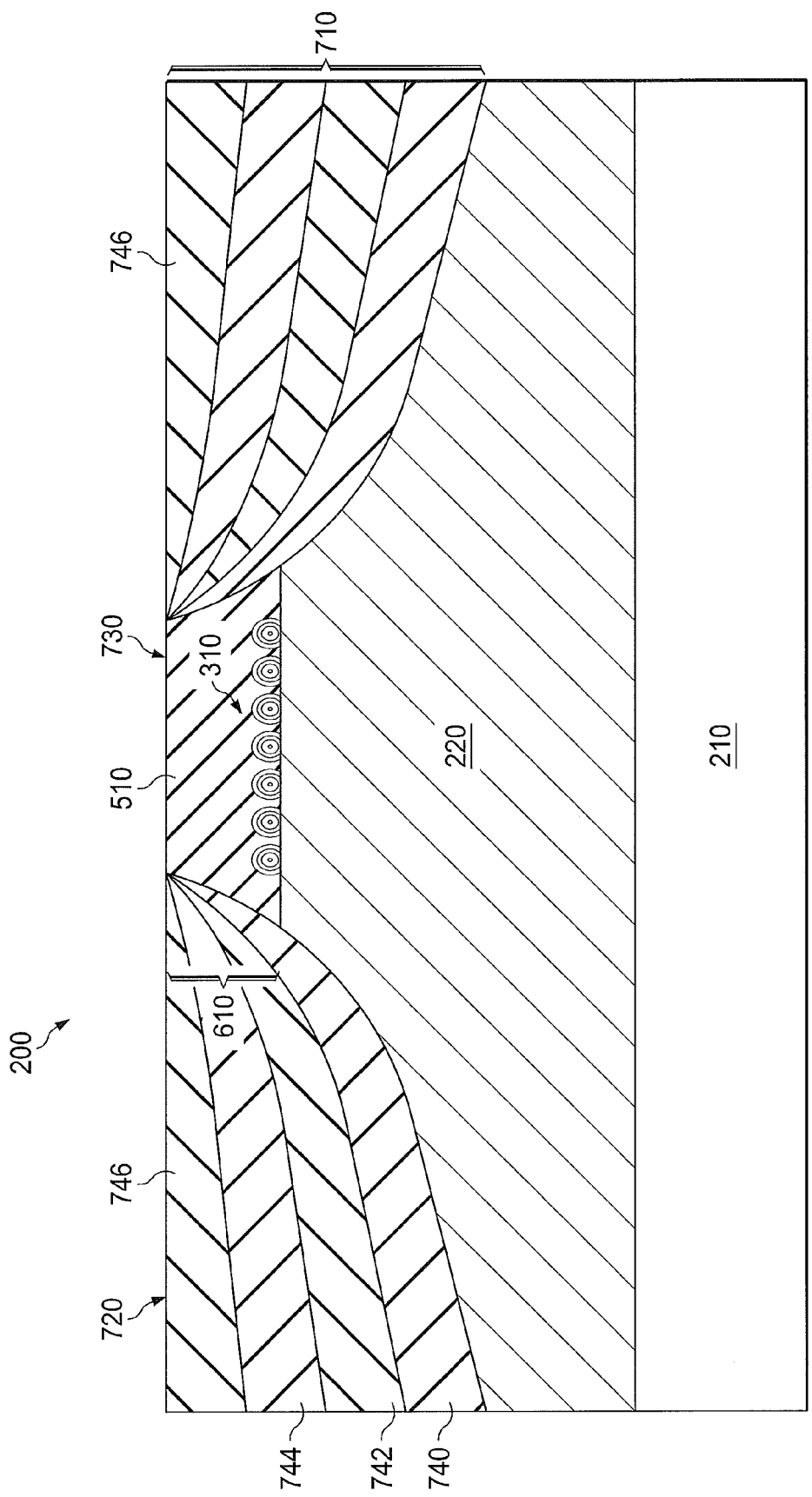

FIG. 7 shows the device 200 after removing the hard mask (e.g., an HF acid wet etch to remove a silica glass hard mask), and, after growing an insulating layer 710 in the openings 620 (FIG. 6). The insulating layer 710 is grown such that an upper surface 720 of the insulating layer 710 may be co-planar with an upper surface 730 of the capping layer 510.

In some embodiments growing the insulating layer 710 in the openings 620 can include deposition of InP alloy layers that are successive doped with p-type dopants (p-layer 740), n-type dopants (n-layer 742), insulating-type dopants (i-layer 744), and p-type dopants (second p-layer 746), respectively. In some cases, for example, the p-layer 740 and second p-layer 746 are Zn-doped InP, the i-layer 744 is Fe-doped InP, and the n-layer 744 is Si-doped InP. In some preferred embodiments, the layers 740, 742, 744, 746 are consecutively deposited by MOVPE processes at a fourth temperature that is greater than the second temperature (e.g., 600° C. or higher).

Figure 8:
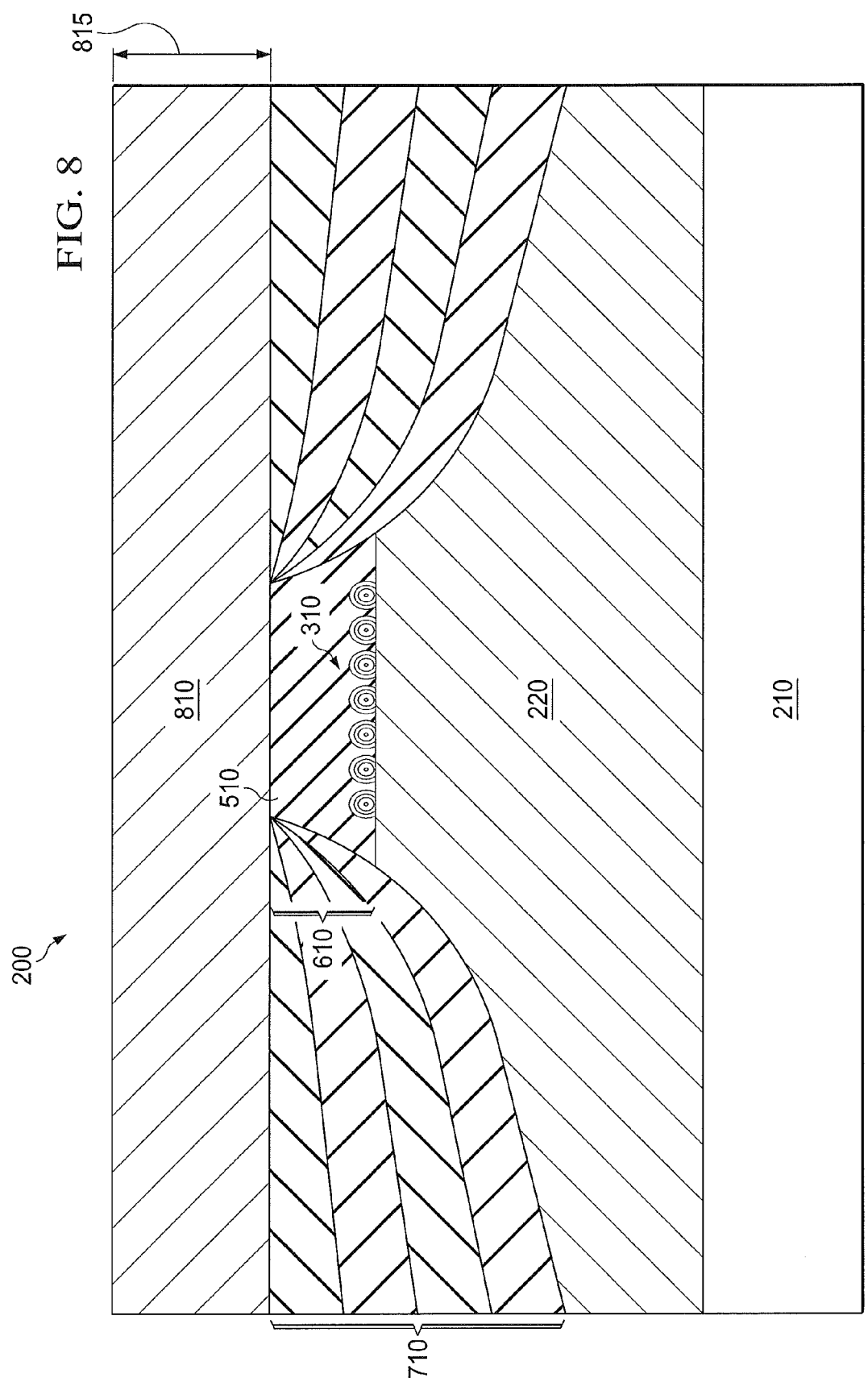

FIG. 8 shows the device 200 after forming a second p-doped capping layer 810 on the p-doped III-V capping layer 510 and insulating layer 710. In some embodiments the second capping layer has a thickness 815 of about 1500 nanometers. The second p-doped capping layer 810 can be the same III-V materials (e.g., Zn-doped InP alloy) and can be deposited by the same MOVPE process as used to form the first p-doped capping layer 510.

Burying the active strip layer 610 between InP alloy layers may provide improved heat dissipation from the active layer 310 via the InP layers. For example, an InP alloy buffer layer 220 and InP alloy capping layers 510, 810 typically can have higher thermal conductivity than many ternary or quaternary III-V alloy layers. For instance, in some embodiments an electronic-photonic device 200 configured as a buried heterostructure laser and comprising the buried active strip layer 610 can effectively emit in the C-band telecommunications range, for a device 200 operating up to about 80° C. For such operating temperatures, there may be no need to couple an extra active or passive heat sink device to the electronic-photonic device 200.

Figure 9:
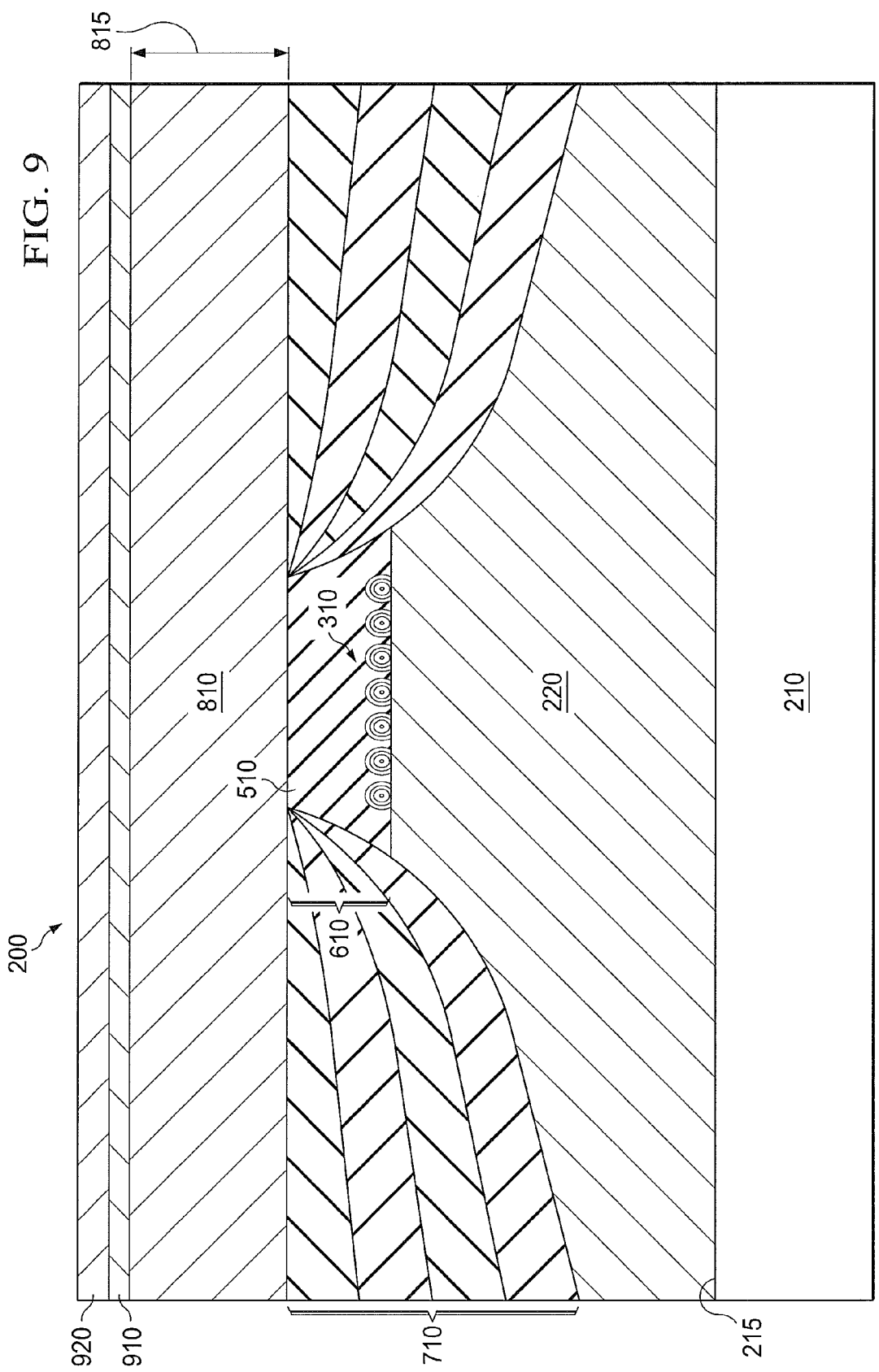

FIG. 9 shows the device 200 after forming a III-V material contact layer 910 on the second p-doped capping layer 810. The contact layer 910 provides an area upon which an electrically conductive contact 920 can be formed. In some cases, the III-V alloy material contact layer 910 is composed of a p+-doped III-V alloy material, such as a Zn-doped InGaAsP alloy deposited by MOVPE or by other conventional deposition processes. In some cases, the contact 920 is composed of a metal such as Al or Ag deposited by a conventional process, such as physical vapor deposition. In other cases the contact 920 can be composed of, or include, a non-metal such as heavily doped polysilicon.

One of ordinary skill in the art would understand how the substrate 210 could be diced to provide separate devices 200 (e.g., transmitter, receiver, or transceiver) for incorporation into an optical apparatus such as a fiber optic telecommunication system.

FIGS. 2-9 illustrate another aspect of the disclosure, an electronic-photonic device 200. The device 200 can be made, and, include any of the features, discussed in the context of FIG. 1.

The device 200 includes an active layer strip 610 that includes a plurality of spheroid-shaped quantum dots 340 (FIG. 5). Each of the quantum dots 340 includes a multilayered concentric stack of layers 335. The stack of layers 335 includes a first inner III-V high-band-gap layer 320 (e.g., a InGaAsP alloy), a well layer 325 (e.g., an InAs alloy) on the first III-V high-band-gap layer 320 and a second outer III-V high-band-gap layer 330 (e.g., a InGaAsP alloy) on the well layer 325 (FIG. 3C). The dots 340 can have consecutive concentric well layer 325 interleaved with second outer III-V high-band-gap layer 330. In such embodiments the second outer III-V high-band-gap layers are all outer layers with respect to the first inner III-V high-band-gap layer 320 and one of the second outer III-V high-band-gap layer 330 is an outermost or exterior layer.

In some preferred embodiments the active strip 610 has a peak photoluminescence wavelength in the C-band telecommunications range (e.g., 1.55±0.02 microns). As noted above, the formation of quantum dots 340, and the dot's 340 photoemission at a desired target C-band telecommunications range, can be facilitated by having have particular ratios of group V elements to group III elements in the alloy layers that comprise the dots 340. For instance, in some preferred embodiments, the first III-V high-band-gap layers 320 and second III-V high-band-gap layers 330 both are composed of an $In_wGa_xAs_yPz_z$ alloy where w, x, y and z define molar percentages of the respective elements and the ratio (w+x):(y+z) is in a range of 19:1 to 21:1. In some preferred embodiments the well layer 325 is composed of an $In_mAs_n$ alloy where m:n equals about 1:1.

In some preferred embodiments, the device 200 further includes a planar crystalline substrate 210 of InP alloy having a surface 215 with a (100) crystallographic plane, and an epitaxial III-V buffer layer 220 of Si-doped InP alloy on the substrate surface 215 (FIG. 9). In some preferred embodiments, the active layer strip 610 is located on the epitaxial III-V buffer layer 220. In some preferred embodiments, there can be a plurality of well layers 325 (FIGS. 3A-3C) of InAs alloy in the concentric stack of layers 335 (FIG. 5).

In some preferred embodiments, the device 200 also includes a Zn-doped InP alloy III-V capping layer 510 on the active strip layer 610 (FIG. 9). In some preferred embodiments, the device 200 further includes an InP alloy insulating layer 710 on the Si-doped InP alloy epitaxial III-V buffer layer 220, and, adjacent to the active strip 610 and the Zn-doped InP alloy III-V capping layer 510. A pnin-doped insulating layer 710 of InP alloy can comprise consecutive layers 740, 742, 744, 746 of Zn-doped, Si-doped, Fe-doped and Si-doped InP alloy layers. Some preferred embodiments of the device also include a second capping layer 810 of Zn-doped InP alloy on the pnin-doped insulating layer 710 and capping layer 510.

In some embodiments, the electronic-photonic device 200 configured as a buried hetro-structure laser. Some preferred embodiments of the buried hetro-structure laser can have a laser threshold of about 800 mAmp. In some embodiments, the electronic-photonic device 200, configured as a buried hetro-structure laser, produces about 2 mW or more of optical power at an injection current of about 900 mAmp.

Although some embodiments of the disclosure have been described in detail, those of ordinary skill in the art should understand that they could make various changes, substitutions and alterations herein without departing from the scope of the disclosure.

What is claimed is:

1. An electronic-photonic device, including:
   an active layer strip located on a n-doped III-V epitaxial composite semiconductor alloy buffer layer, said active layer strip including:
      a plurality of spheroid-shaped quantum dots, each of said spheroid-shaped quantum dots including a multilayered concentric stack of:
         a first inner III-V composite semiconductor alloy high-band-gap layer,
         a III-V composite semiconductor alloy well layer on said first inner III-V composite semiconductor alloy high-band-gap layer, and
         a second outer III-V composite semiconductor alloy high-band-gap layer on said III-V composite semiconductor alloy well layer, and
   wherein said active layer has a photoluminescence intensity emission peak in the telecommunication C-band.

2. The device of claim 1, wherein said electronic-photonic device is configured as a buried hetero-structure laser.

3. The device of claim 1, wherein said first inner III-V composite semiconductor alloy high-band-gap layer includes an InGaAsP alloy.

4. The device of claim 1, wherein said III-V composite semiconductor alloy well layer includes an InAs alloy.

5. The device of claim 1, wherein said III-V composite semiconductor alloy well layer includes an $In_m As_n$ alloy wherein a ratio m:n equals about 1:1.

6. The device of claim 1, wherein said second outer III-V composite semiconductor alloy high-band-gap layer includes an InGaAsP alloy.

7. The device of claim 1, wherein said spheroid-shaped quantum dots include concentric said said III-V composite semiconductor alloy well layers interleaved with said second outer III-V composite semiconductor alloy high-band-gap layers.

8. The device of claim 6, wherein one of said said second outer III-V composite semiconductor alloy high-band-gap layers is an outer-most layer of each of said spheroid-shaped quantum dots.

9. The device of claim 1, wherein said C-band telecommunications band is in a range of 1.55±0.02 microns.

10. The device of claim 1, wherein said first inner and said second outer III-V composite semiconductor alloy high-band-gap layers are both composed of an $In_w Ga_x As_y P_{zz}$ alloy wherein a ratio (w+x):(y+z) is in a range of about 19:1 to 21:1.

11. The device of claim 1, wherein said active layer strip is located on an epitaxial III-V buffer layer.

12. The device of claim 11, further including an InP alloy insulating layer located on said epitaxial III-V buffer layer.

13. The device of claim 12, wherein said InP alloy insulating layer includes consecutive layers of a Zn-doped InP alloy layer, a Si-doped InP alloy layer, a Fe-doped InP alloy layer and a Si-doped InP alloy layer.

14. The device of claim 11, wherein said epitaxial III-V buffer layer is located on a substrate.

15. The device of claim 14, wherein said epitaxial III-V buffer layer is located on a surface of said substrate having a (100) crystallographic plane.

16. The device of claim 11, wherein said epitaxial III-V buffer layer is located on a substrate composed of a crystalline InP alloy.

17. The device of claim 1, further including a Zn-doped InP alloy III-V capping layer located on said active strip layer.

18. The device of claim 17, further including a second capping layer of Zn-doped InP alloy located on said Zn-doped InP alloy III-V capping layer and on an InP alloy insulating layer.

19. The device of claim 2, wherein said buried hetero-structure laser has a laser threshold of about 800 mAmp.

20. The device of claim 2, wherein said buried hetero-structure laser produces about 2 mW or more of optical power at an injection current of about 900 mAmp.

* * * * *